(12) United States Patent
Le et al.

(10) Patent No.: US 6,782,047 B1
(45) Date of Patent: Aug. 24, 2004

(54) VARIABLE LENGTH ENCODING OF COMPRESSED DATA

(75) Inventors: Khiem Le, Coppell, TX (US); Zhigang Liu, Irving, TX (US); David Leon, Irving, TX (US)

(73) Assignee: Nokia Networks Oy, Espoo (FI)

(*) Notice: Subject to any disclaimer, the term of this patent is extended or adjusted under 35 U.S.C. 154(b) by 0 days.

(21) Appl. No.: 09/536,638

(22) Filed: Mar. 28, 2000

Related U.S. Application Data (60) Provisional application No. 60/164,330, filed on Nov. 9, 1999.

(51) Int. Cl.[7] ................................................ H04B 1/66
(52) U.S. Cl. ........................................ 375/240; 341/67
(58) Field of Search ........................... 375/240; 341/51, 341/65, 67; 370/202; 704/500, 503; 710/68

(56) References Cited

U.S. PATENT DOCUMENTS

| | | | | |
|---|---|---|---|---|
| 4,870,662 A | * | 9/1989 | Lindbergh et al. | .......... 375/240 |
| 4,891,643 A | * | 1/1990 | Mitchell et al. | ............ 341/107 |
| 5,293,379 A | | 3/1994 | Carr | .......................... 370/94.1 |

OTHER PUBLICATIONS

Casner, S. et al , "Compressing IP/UDP/RTP Headers for Low–Speed Serial Links", appearing in IETF Internet Dravt, Jul. 27, 1998, pp. 1–22 XP002125101.

Degermark M. et al, "Low–Loss TCP/IP Header Compression for Wireless Networks", appearing in Wireless Networks, US, ACM, vol. 3, No. 5, Oct. 1, 1997 pp. 375–387, XP000728935.

Handley M: "GeRM: Generic RTP Multiplexing", appearing in Internet Engineering Task Force, XX, XX, Nov. 11, 1998, pp. 1–7, XP002139359.

* cited by examiner

*Primary Examiner*—Jean B. Corrielus
(74) *Attorney, Agent, or Firm*—Antonelli, Terry, Stout & Kraus, LLP

(57) ABSTRACT

The invention is a method and system for compressing a current value into a minimum number of bits for transmission from a compressor to a decompressor. A method in accordance with the invention includes maintaining a series of at least one previous value at the compressor, each previous value having different k least significant bits and which have been transmitted to the decompressor; determining a value of k representing a smallest number of bits which allows successful decompression of the current value at the decompressor using as a reference value any value in the series of at least one previous value; and transmitting the current value from the compressor to the decompressor in compressed form with the k least significant bits of the current value.

60 Claims, 9 Drawing Sheets

| LENGTH | k LSB OF THE VALUE |

VARIABLE LENGTH ENCODING OF COMPRESSED DATA

CROSS REFERENCE TO RELATED APPLICATIONS

This application claims the filing date of U.S. provisional application Serial No. 60/164,330, filed Nov. 9, 1999, entitled "Variable Length Encoding of Compressed Data".

Reference is made to U.S. patent application Ser. No. 09/522,497, filed on Mar. 9, 2000, now U.S. Pat. No. 6,300,887 entitled "An Efficient Handoff Procedure for Header Compression", which application is assigned to the Assignee hereof and which is incorporated herein by reference in its entirety.

Reference is also made to U.S. patent application Ser. No. 09/536,639, filed on even date herewith, entitled "Method and System for Transmitting and Receiving Packets", which application is assigned to the Assignee hereof and which is incorporated herein by reference in its entirety.

BACKGROUND OF THE INVENTION

1. Field of the Invention

The invention relates to high efficiency data compression including packet header compression.

2. Description of the Prior Art

There are many areas where it is critical to be able to compress a sequence of values, in an manner that is efficient and robust to errors. An example is IP/UDP/RTP header compression to carry real-time IP-based multi-media traffic over cellular networks. Due to the large size of the IP/UDP/RTP header and the bandwidth limitations of cellular systems, compression efficiency is a must. Error robustness is also required due to the error-prone characteristics of the cellular link.

The RTP header compression described in Internet Engineering Task Force (IETF) RFC 2508, February 1999, achieves high compression efficiency on a lossless compressor-decompressor link. It can compress most of the headers to as low as two bytes. However, this scheme is not robust to errors. The problems encountered are error propagation and increased compressed header sizes. Error propagation refers here to the fact that if a compressed header is hit by an error, not only is this compressed header not decodable but the following compressed headers will likely not be decodable even though they are error free. Increased compressed header size refers here to the fact that because of the error recovery procedure, compressed headers on a lossy link are larger than the optimal 2 bytes achieved on a lossless link. Limitations of RFC 2508 are hereinafter discussed.

Header compression schemes take advantage of the fact that certain information fields carried in the headers either 1.) do not change (called here 'Type 1' header fields) or 2.) change in a fairly predictable way (called here 'Type 2' header fields). Other fields, referred to as 'Type 3' header fields, vary in such a way that they cannot be truly predicted.

Examples of Type 1 header fields are the IP address, UDP port number, RTP SSRC (synchronization source), etc. These fields need only be transmitted to the receiver/decompressor once during the course of a session (as part of the packet(s) transferred at session establishment, for example).

Examples of Type 2 header fields are the RTP time stamp, RTP sequence number, and IP ID fields. All have a tendency to increment by some constant amount from packet to packet. Thus, there is no need for these values to be transmitted within every header. It is only required that the decompressor be made aware of the constant increment (differential) value, called delta in RFC 2508. The decompressor utilizes these deltas to regenerate up-to-date Type 2 field values when reconstructing the original header. In other words, differential encoding is used to compress type 2 header fields.

The IP-ID field for most of IP stack implementations increments by a fixed amount for every packet sent by the source. Therefore as long as an RTP stream packets are not interleaved with other packets from the same source on the compressor-decompressor (CD)-channel, the IP-ID delta is constant and does not need to be transmitted.

An Example of a Type 3 header field is the RTP M-bit (Marker), which indicates the occurrence of some boundary in the media (e.g., end of a video frame). Because the media normally varies in unpredictable ways, this information cannot be truly predicted.

The above mentioned limitations of header compression schemes stem from the delta encoding used for type 2 fields. Because of differential encoding, if a single compressed header is lost, all the following compressed headers are not decodable because they are recursively predicted from a compressed header which is not decodable. This is what we called error propagation.

An algorithm used to recover from error propagation is known as the "twice" algorithm which can be used if the packet UDP checksum is transmitted in the compressed packet. Compressed packets on the CD-link carry a 4-bit sequence number which is incremented by one for each compressed packet sent by the compressor. The decompressor uses this sequence number to detect compressed packet loss on the link. If the sequence number increases by more than one, the decompressor hopes that all the compressed packet deltas have not changed since the last compressed packet delta and add one delta for each lost packet. The decompressor checks then that the assumption was valid by computing the decompressed packet UDP checksum and checking if it matches the transmitted UDP checksum.

The twice algorithm is too limiting. First, it requires transmission of the checksum (2 bytes) in every compressed packet and thus significantly reduces the compression efficiency. Second, for a typical audio stream, the twice algorithm works only if there has not been any TS or IP-ID jumps since the last decompressed packet.

When the decompressor is not able to decompress a packet, it sends an negative acknowledgment Nack to the compressor. Upon reception of Nack, the compressor has to send uncompressed header fields. The Nack mechanism thus incurs audio or video outages of a duration of at least one round-rip delay and decreased compression efficiency, since fields have to be sent uncompressed.

In order to limit error propagation, the compressor may use a refresh mechanism whereby it sends periodically uncompressed field values even though this is not requested by the decompressor. However such a mechanism further decreases compression efficiency.

Another limitation of RFC 2508 is the compressed header short sequence number. When the decompressor receives a header with a sequence number that is not consecutive from the previous one, packet loss is detected and a recovery scheme is employed to resynchronize the compressor and decompressor. Just using a short sequence number to detect packet loss is not robust to an error-prone link, such as wireless where 'long loss' may happen frequently. Long loss is defined as the loss of 'sequence cycle' or more packets in a row. When long loss occurs, the sequence number in the packet received by decompressor 'wraps around'. For example, assume the sequence number consists of k bits, hence the sequence cycle equals to $2^k$. If $2^k$ packets are lost in a row, the decompressor fails to detect the packet losses since it still sees a consecutive sequence number in the incoming packets.

SUMMARY OF THE INVENTION

The invention is a robust and efficient encoding scheme which in one embodiment is referred to as VLE (variable length encoding). VLE and other embodiments of the invention solve the error propagation and efficiency drop of the prior art.

The invention is based in part on the observation, that header type 2 fields received at the compression point show an increasing trend. This implies that fields from consecutive headers tend to have the same MSBs (most significant bits) and differ only by their LSBs (least significant bits). Compression can thus be achieved by transmitting only the LSBs.

The invention allows the compressor to determine the minimum number of LSBs to be sent such that this number is sufficient to allow correct decompression whenever the loss occurs of previous compressed packets on the CD-link.

The invention can be applied to any series of values. The more clustered (i.e. close to each other) the values, the higher the efficiency.

A method of compressing a current value into a minimum number of bits for transmission from a compressor to a decompressor in accordance with the invention includes maintaining a series of at least one previous value at the compressor, each previous value having different k least significant bits and which have been transmitted to the decompressor; determining a value of k representing a smallest number of bits which allows successful decompression of the current value at the decompressor using as a reference value any value in the series of previous values; and transmitting the current value from the compressor to the decompressor in compressed form with the k least significant bits of the current value. The value of k may be determined by comparing the current value with the previous values to determine a maximum difference r between the current value and the previous values with k being an integer chosen to be the smallest integer which is greater than $\log_2^{(r)}+1$. The decompressor may transmit at least one acknowledgment to the compressor which indicates that the decompressor has decompressed a value and the compressor may update the series of at least one previous value to discard an older at least one previous value. The decompressor may decompress the current value with a reference value of a last value of the series of at least one previous value to be decompressed as a value having k least significant bits identical to the k least significant bits of the received current value which is closest to the reference value. The decompressor may use a search interval which contains values which range from less than to greater than the reference value; and may choose from the values within the search interval the value having the identical k least significant bits. The values may be produced from mapping a reference value v_ref and the number of bits k to the series of at least one previous value and the current value; and the series of at least one previous value may be updated to have as an oldest value an oldest transmitted value which has been acknowledged to have been decompressed by the decompressor. The values may be a function of a reference value and the number of bits k. The function may be $]v\_ref-2^{k-1}, v\_ref+2^{k-1}]$. The function may be $]v\_ref, v\_ref+2^k]$. The at least one acknowledgment may be the received uncompressed or compressed value. The at least one acknowledgment may be the received compressed value including information used in coding a portion of the compressed value. The at least one acknowledgment may contain an oldest value in the series of the at least one previous value. The series of at least one previous value may be updated to discard older previous values based upon an estimated maximum number of values which can be lost during transmission in a sequence of values between the compressor and the decompressor. The compressed current value may encode the number k which is transmitted with the current value. The encoding may be Huffman encoding. The values may comprise RTP headers. The at least one acknowledgment may be an acknowledgment of an RTP SN header representing an acknowledgment of TS and IP-ID in the RTP header.

A system for compressing a current value into a minimum number of bits in accordance with the invention includes a compressor which maintains a series of at least one previous value, each previous value having different k least significant bits; a decompressor which receives the current value compressed into a minimum number of k least significant bits from the compressor; and wherein the compressor determines a value of k representing a smallest number of bits which allows successful decompression of the current value at the decompressor using as a reference any value in the series of at least one previous value. The value of k may be determined by comparing the current value with the at least one previous value to determine a maximum difference r between the current value and the at least one previous value with k being an integer chosen to be the smallest integer which is greater than $\log_2^{(r)}+1$. The decompressor may transmit at least one acknowledgment to the compressor which indicates that the decompressor has decompressed a value and the compressor may update the series of at least one previous value to discard an older at least one previous value. The decompressor may decompress the current value at the decompressor with a reference value of a last value of the series of at least one previous value to be decompressed as a value having k least significant bits identical to the k least significant bits of the received current value which is closest to the reference value. The decompressor may use a search interval which contains values which range from less than to greater than the reference value; and may choose from the values within the search interval the value having the identical k least significant bits. The compressor may produce the values from mapping a reference value v_ref and the number of bits k to the series of at least one previous value and the current value; and the series of at least one previous value may be updated to have as an oldest value an oldest transmitted value which has been acknowledged to have been decompressed by the decompressor. The function may be $]v\_ref-2^{k-1}, v\_ref+2^{k-1}]$. The function may be $]v\_ref, v\_ref+2^k]$. The acknowledgments may be the received uncompressed value. The at least one acknowledgment may be the received compressed value. The at least one acknowledgment may be the received compressed value including information used in coding a portion of the compressed value. The series of at least one previous value may be updated by the compressor to discard at least one older previous value based upon an estimated maximum number of values which can be lost during transmission in a sequence of values between the compressor and the decompressor. The compressed current value may encode the number k which is transmitted with the current value. The values may comprise RTP headers. The at least one acknowledgment may be an acknowledgment of an RTP SN header representing an acknowledgment of TS and IP-ID in the RTP header.

DESCRIPTION OF THE PREFERRED EMBODIMENTS

Basic Concepts and Rules

Figure 1:
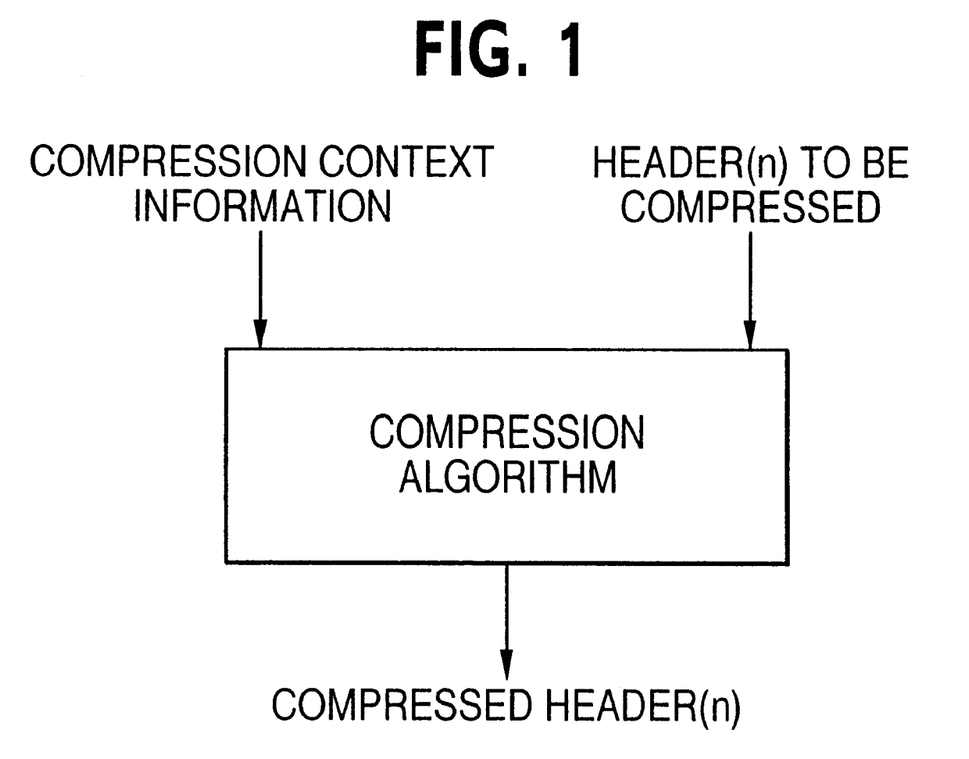
FIG. 1 conceptually illustrates compression of information.
Figure 3:
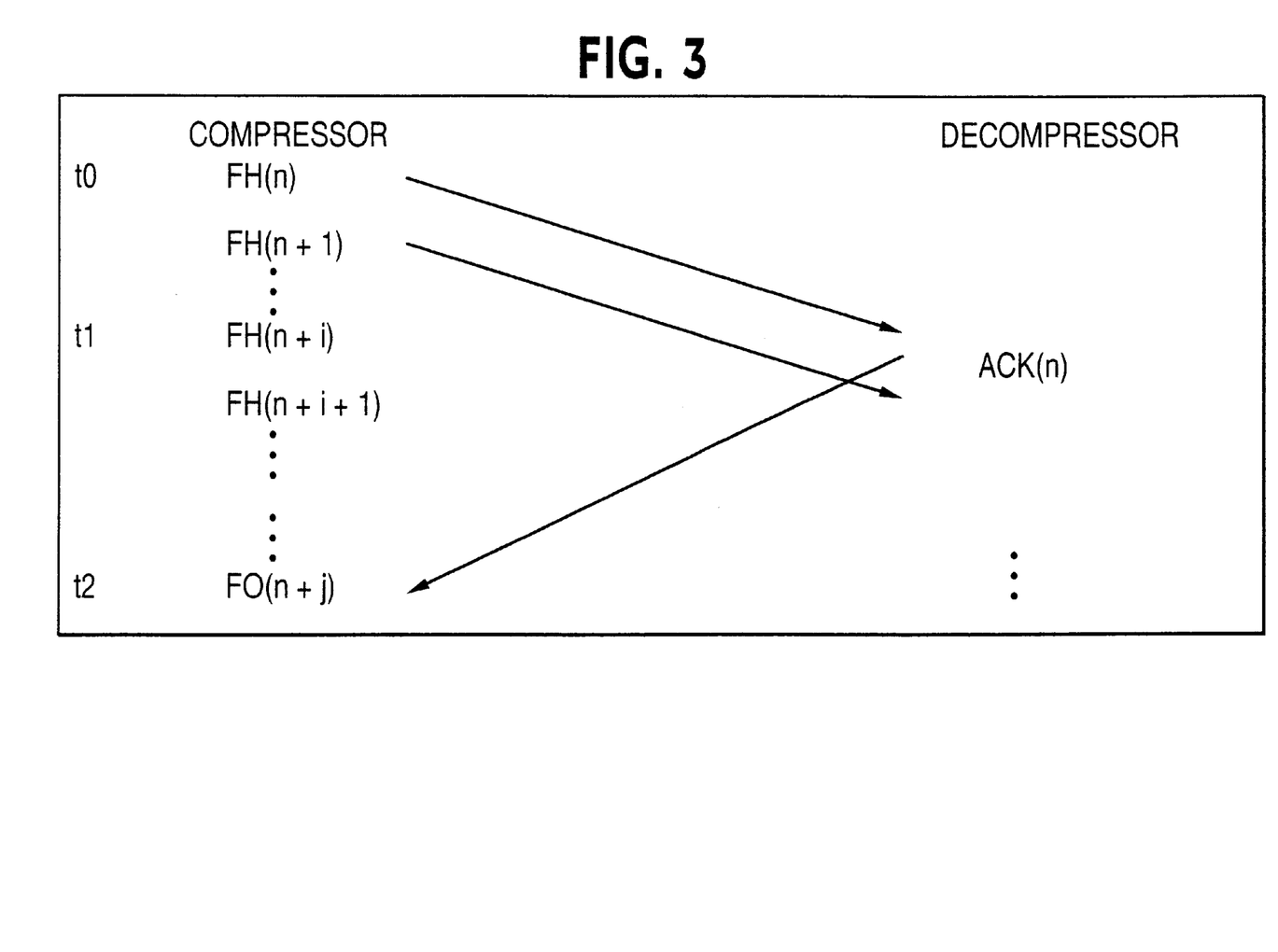
FIG. 3 illustrates the transition of a compressor from transmitting headers having a higher number of bits to headers having a lower number of bits using acknowledgments in accordance with the present invention.
Figure 4:
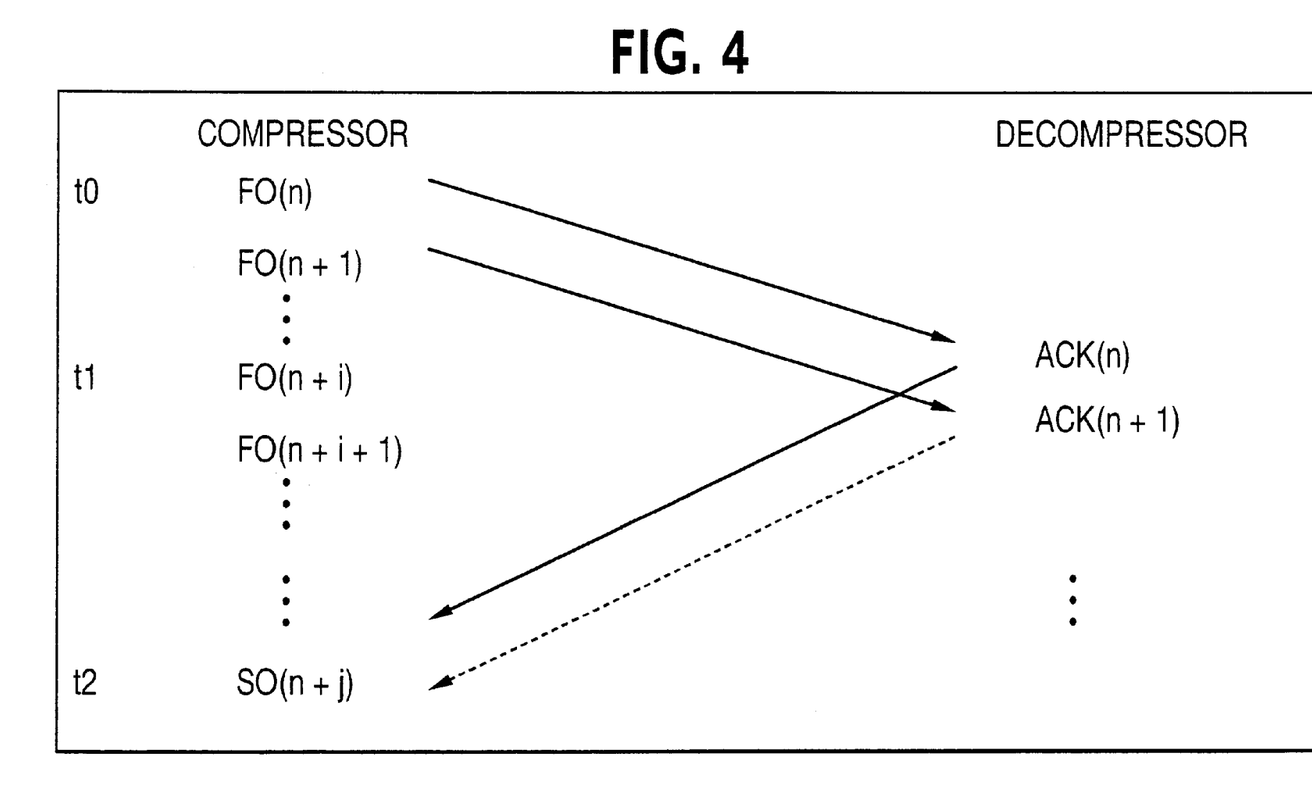
FIG. 4 illustrates the transition of a compressor from transmitting headers with a first order of compression to headers with a second order of compression in accordance with the present invention.

FIG. 1 illustrates conceptually compression information and examples thereof. Compression context information is a set, subset or representative of a subset of information which may be without limitation any type of information including a header used by a compressor as illustrated in FIGS. 3 and 4 as an input to the compression algorithm to produce compressed information which may be without limitation a compressed header. The other input is from the source of the information to be compressed which is illustrated without limitation in the example as headers to be compressed.

Figure 2:
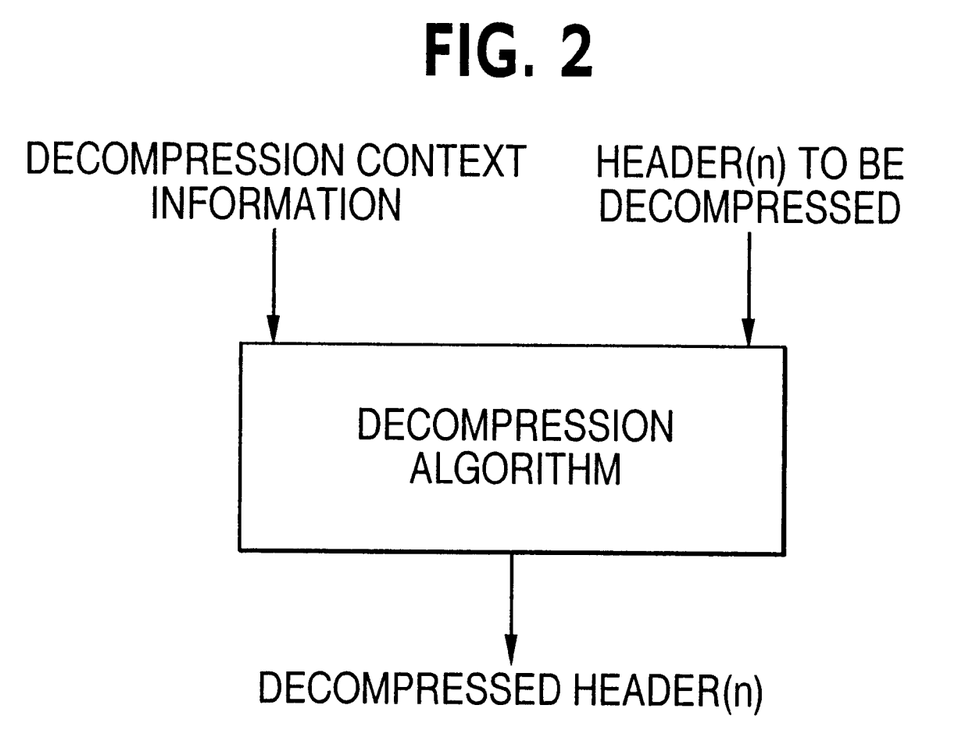
FIG. 2 conceptually illustrates decompression of information.

FIG. 2 illustrates conceptually decompression of information and examples thereof. Decompression context information is a set, subset or representation of a subset of information which may be without limitation any type of information including a header used by a decompression as illustrated in FIGS. 3 and 4 as an input to the decompression algorithm to produce decompressed information which may be without limitation a decompressed header. The other input is from the information to be decompressed which is illustrated without limitation in the example as headers to be decompressed.

Both the compression and decompression context informations are dynamic, that is, they may be updated by the compressor and decompressor respectively. The frequency of updates depends on the header compression mechanism. Events that may result in an update of the compression context information at the compressor include the compression of an incoming header, or the receipt of feedback from the decompressor. Events that may result in an update of the decompression context information at the decompressor include the decompression of an incoming header.

The Compressor can be in one of 3 states:
FH (Full Header) state
FO (First Order) state
SO (Second Order) state The compressor operates in the FH state in the initialization phase. In the FH state, the compressor sends a full RTP header. This state is normally just a transient state which only happens at the beginning of an RTP session or in the middle of a session due to very exceptional events, e.g., the compressor fails or loses memory.

The compressor operates in the FO state in the update phase. In the FO state, the transmitter sends a FO header, i.e. a packet whose header carries the fields that have changed compared to the reference header, appropriately encoded, along with the sequence number. The decompressor is expected to acknowledge as illustrated in FIGS. 3 and 4 a certain number of FOs, where the number depends on the pattern. For example, if the pattern is linear with constant parameters, only one acknowledgment is needed to transition to the extrapolation phase.

The compressor operates in the SO state in the extrapolation phase. In this state, the transmitter sends a SO packet, i.e. a packet whose header is essentially just a sequence number. The decompressor may or may not acknowledge a correctly received SO packet.

A type of mathematical function, which may be used with the invention but to which the invention is not limited, used in VLE is described as follows. Such a function, denoted as $f(k,v\_ref)=(v\_1, v\_2,\Box.,v\_2^k)$, maps to an integer value $v\_ref$ called reference value and a number of bits k to a k-tuple of integers which all have different k LSBs.

Although any such function could be appropriate, one preferred embodiment uses only functions which return consecutive values $v\_1, v\_2,\Box.,v\_2^k$, i.e. $v\_i=v\_1+i-1$. In other words, the function has an interval of length $2^k$ values. The interval can be written as $]v\_ref-C(k, v\_ref, v\_ref-C(k, v\_ref+2^k]$ where C is an integer value which is function of k and $v\_ref$. Here again, although any such interval could be of interest, one preferred embodiment uses $C(k, v\_ref)=0$ and $C(k,v\_ref)=2^{k-1}$. In other words, the embodiment uses the intervals $]v\_ref-2^{k-1}, v\_ref+2^{k-1}]$ and $]v\_ref, v\_ref+2^k]$.

A VLE embodiment based on the $]v\_ref-2^{k-1}, v\_ref+2^{k-1}]$ interval is described as follows. The system is composed of a compressor, a decompressor and a CD-channel as illustrated in FIGS. 3 and 4, i.e. the link between the compressor and the decompressor. The channel may be error-prone. The only assumptions made with this embodiment, which are not limiting, are that compressed values are not reordered by the channel and the compressed values which are given as inputs to the decompressor are not corrupted (or in other words corrupted headers are treated as lost headers). The channel may be a simplex link, i.e. carries only compressed values from the decompressor or duplex, i.e. the channel carries also feedback from the decompressor to the compressor as illustrated in FIGS. 3 and 4. In the preferred embodiment a duplex channel is used.

The first phase is the acquisition by the decompressor of an initial value. This may be performed by the compressor sending uncompressed values at the start of the communication or any other suitable means. The decompressor may use a feedback channel to acknowledge the received value as illustrated in FIGS. 3 and 4. The initialization is completed without limitation when the compressor has received one feedback acknowledgment and VLE encoding can then be used for compression. In VLE, values are compressed as a variable number of bits k. The operation of the decompressor in the VLE mode is first discussed.

Figure 7A:
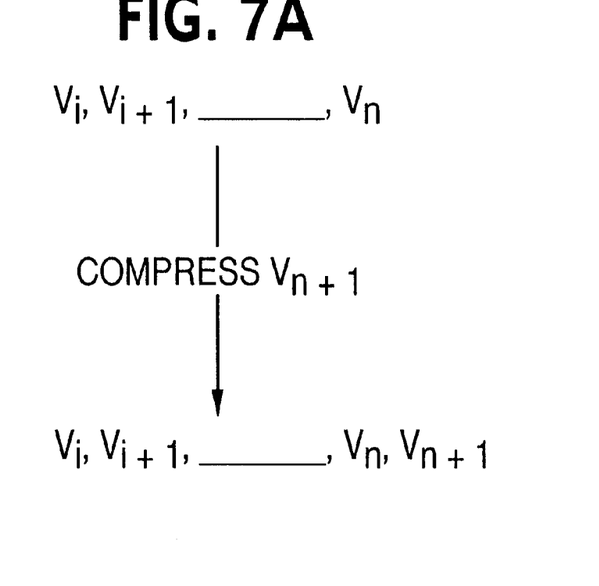
FIGS. 7A and 7B illustrate the use of a sliding window of values stored by the compressor in accordance with the invention.
Figure 7B:
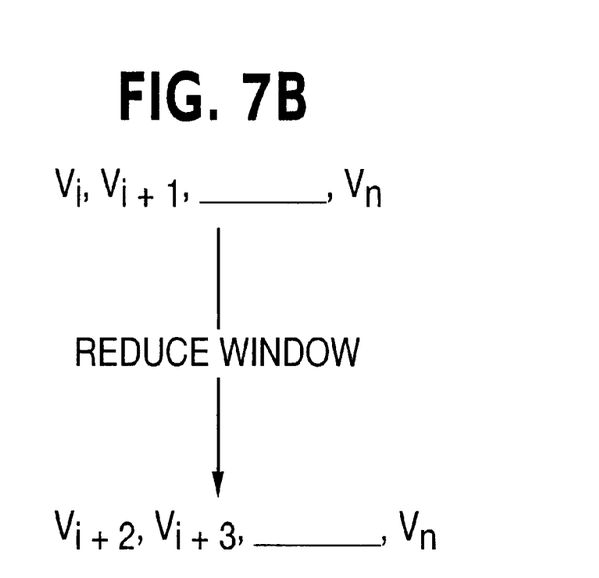

FIGS. 7A and 7B illustrate a window update process. The window is comprised of previous values which are inputted to the compressor and may be compressed but are not required to be compressed. It is assumed that the window is $v_i, v_{i+1}, \ldots, v_n$ at a contain point of time:

(1) When a new value $V_{n+1}$ is compressed, the window is enlarged in order to include this new value as illustrated in FIG. 7A.

(2) The window is then reduced, as illustrated in FIG. 7B, by removing older value(s) (in that example, $v_i$ and $v_{i+1}$) when the compressor knows that these values cannot be used by the decompressor anymore which, in this example, could be when the reception of an acknowledgment for the value $v_{i+2}$ occurs.

Decompression

The reference value is the last value decompressed by the decompressor. The compressor may be signalled of decompression by the reception of an acknowledgment as illustrated in FIGS. 3 and 4 or on the assumption that an actual value has been received in view of the transmission of a series of values over sufficient time duration that at least one value is statistically likely to be received and decompressed without use of any feedback from the decompressor. The decompressor decompresses an incoming compressed value by providing the only value in the interval $]v\_ref-2^{k-1}, v\_ref+2^{k-1}]$ whose k LSBs are a match of the k bits received. This search interval is a special instance of the functions introduced earlier. The decompressed value becomes the v_ref which will be in turn used to decompress the next incoming compressed value. In the preferred embodiment, the decompressor acknowledges at least some of the packets which have been decompressed such as illustrated in FIGS. 3 and 4. The number of packets which have to be acknowledged is totally flexible and is chosen to meet the specifications of the desired application. The more acknowledgments which are transmitted from the decompressor to the compressor, the higher the compression efficiency on the forward link as will be shown hereafter.

Compression

Reference is now made to the compressor operations. The compressor maintains a sliding window of values it has compressed and transmitted to the decompressor which are illustrated in FIGS. 7A and 7B. In the one embodiment, the window holds the latest value for which it has received an acknowledgment from the decompressor and all the following transmitted values in the order they were transmitted to the decompressor. The compressor also maintains the minimum and maximum values v_min and the v_max respectively of the sliding window.

When a new uncompressed value v reaches the compressor, the compressor sends k LSBs of v such that v be in the interval $]v\_i-2^{k-1}, v\_i+2^{k-1}]$ for every v_i of the sliding window. This can be conveniently expressed by $r<2^k-1$ where $r=\max(|v-v\_max|, |v-v\_min|)$. The compressor thus chooses k to be the smallest integer which is more than $\log_2(r)+1$. When the compressor receives an acknowledgment, it removes from its window all the values which have been sent prior the acknowledged value as discussed above with reference to FIG. 7B.

The following discussion demonstrates why VLE always provides correct decompression and is a very flexible compression mechanism.

As long as the compressor and decompressor follow the above-described rules, correct decompression occurs whatever the losses are on the CD-channel between the compressor and decompressor as illustrated in FIGS. 3 and 4. In effect, the reference value v_ref used by the decompressor necessarily belongs to the compressor window, as illustrated for example in FIGS. 5 and 6 between points v_min and v_max, and therefore the encoded value is known to be in the interval $]v\_ref-2^{k-1}, v\_ref+2^{k-1}]$ which is the search interval used by the decompressor.

There is no error propagation with VLE. A compressed packet received by the decompressor can always be decompressed. Packet losses translate into a gradual increase in the compressed packet size.

The more frequent the acknowledgments, the less values in the window and therefore the less LSBs are likely to be sent. This holds especially in the case of header compression where the values to be compressed follow an increasing trend and where v-v_ min increases for each new value v until an acknowledgment is received.

The length of the compressed value must be known to the decompressor. In some cases this length can be known without any additional signaling, for example through the framing information from lower layers of coding. If explicit signaling is needed the preferred embodiment defines a VLE format. The format may have two fields: the length field (i.e. k the number of LSB) and the compressed value field (i.e, k LSB of the original value v) as illustrated in FIG. 8.

Figure 8:
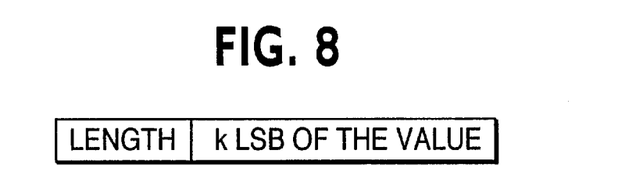
FIG. 8 illustrates an example of VLE encoding format using two encoding fields for transmitting the compressed value in accordance with the present invention.

In a preferred embodiment, the VLE length field, as illustrated in FIG. 8, is itself encoded using Huffman coding. Any other encoding methods (e.g. linear encoding) may be used. For different applications the likelihood of different lengths should be accessed and then a Huffman coding algorithm should be used to encode these data where desirable. The likelihood of encountering a given length on a communication link between the compressor and decompressor can be assessed knowing the link properties (loss and delay) and the decompressor acknowledgment period, as well as the patterns of the original values to be compressed.

To further reduce the length of the length field itself, the compressor may be constrained to choose the length of the field from a reduced set of values. For instance, assuming the uncompressed field is 32 bits and it is desired to encode with a maximum 2-bit length the following lengths which are in a decreasing order of likelihood 4 bits, 8 bits and 32 bits, appropriate code words could be the single bit 0 for 4 bits, the 2-bit value 1 0 for 8 bits and the 2-bit value 1 1 for 32 bits.

Using appropriate coding minimizes the average size of the compressed values.

Furthermore, the length information may not require dedicated bits if the length can be derived from other packet fields. For example, in a typical header compression application a packet type field is transmitted in the compressed header. This packet type field can be used to imply a default length which is rarely exceeded. In the case, where the default length is exceeded, a separate packet type is used. Since this happens only rarely the overhead is overall decreased.

If there is no feedback channel, other (out-of-band) information or additional assumptions are required to move the compressor window forward and keep the k from increasing forever. One way is to assume that at most L consecutive compressed values can be lost along the channel from the compressor to the decompressor. In other words, the compressor knows for sure that at least one out of (L+1)

consecutive compressed values arrives at the decompressor. Therefore, the compressor only needs to store in the window the last (L+1) values that have been sent to the decompressor. Therefore, the range (v_max–v_min), and thus the value of k, depends only on the last (L+1) values sent.

VLE can be applied to RTP header compression. Conversely to RFC 2508, there is no need to use a compressor-decompressor sequence number. Instead, the RTP sequence number is encoded using VLE. The decompressor acknowledges packets such as illustrated in FIGS. 3 and 4 as described in the VLE application by sending to the compressor the RTP SN it has received.

As discussed below regarding optimal acknowledgments, the decompressor does not have to return the uncompressed RTP SN value.

The following example illustrates the working of the present invention for RTP SN compression as set forth in RFC 2508. A series of incoming packets are provided to the compressor whose SN (sequence number) are: 32, 33, 35, 36, 39, 40, 38, 41. Assuming that the decompressor has acknowledged the packet whose sequence number is 35, the compressor keeps a window of sequence numbers as discussed above transmitted since the last acknowledged packet. When the acknowledgment is received, the compressor window is thus: 35, 36, 39, 40, 38, 41. Now it is assumed that a new SN value is coming to the compressor having a SN value of 43. The compressor looks for its window maximum and finds 41. The compressor looks for a window minimum and finds 35. The compressor computes the distance r of the incoming value to its upper (43−41=2) and lower (43−35=8) bounds. The maximum distance is 8. The compressor has to transmit a number of bits k such that the integer is more than $\log_2 r+1$ with $2^k$ being greater than 17 in this example. This number is k=5. Since 43 is written in binary format as 101011, the compressor sends the 5 LSB, i.e. 01011. The decompressor reference value is the last value decompressed by the decompressor and it is for sure one of the values in the compressor window. The decompressor decompresses the incoming value (01011) by returning the value whose 5 LSBs are 01011 and which is the closest to the reference value. Whatever the reference value, this value will always be 43. For example, if it is assumed that the last value received by the decompressor is 40 when it receives the compressed value (i.e. 38 and 41 were lost on the link between the compressor and the decompressor), the search interval used by the decompressor is [25, 56] or in binary format [011001, 111000]. The only value in the interval whose last LSBs are 01011 is 101011, i.e. 43.

Another way for the decompressor to pick the value of k is to choose the closest value to 40 whose LSBs are 01011. The number 40 is 101000 in binary format. The closest value to 101000 whose last LSBs are 01011 is 01011, i.e. 43. This illustrates that whatever the losses on the compressor-decompressor link, the VLE allows determination of the minimum number of LSB bits to be sent which will provide correct decompression.

Figure 5:
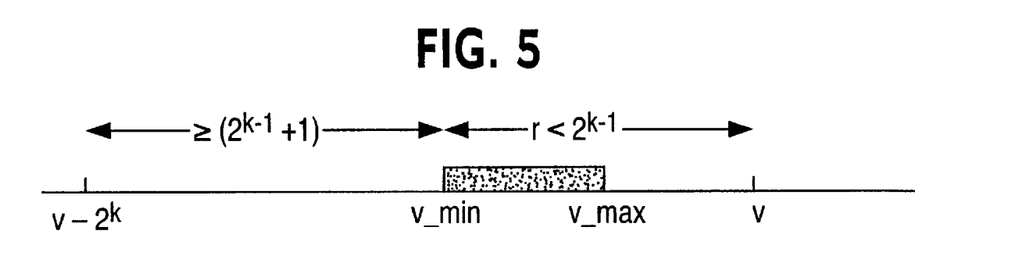
FIGS. 5 and 6 illustrate examples of the selection of the minimum number of bits k in accordance with the invention.
Figure 6:
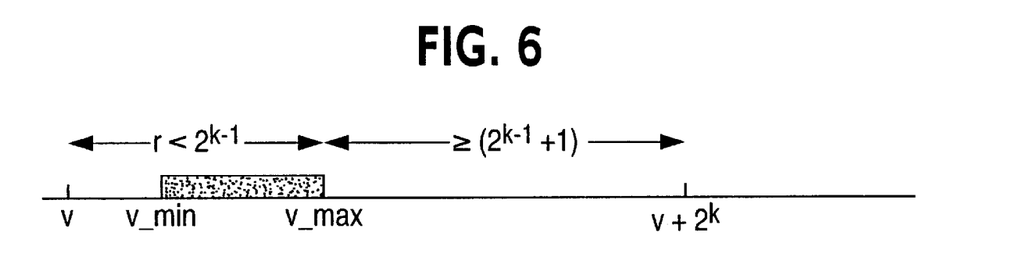

FIGS. 5 and 6 illustrate the picking of k such that the current value to be VLE encoded is among the values having the same LSB and is closest to either a maximum or a minimum in the window. FIG. 5 illustrates the case where v is greater than v_max and FIG. 6 illustrates the case where V is less than v_min.

In the packets where the RTP time stamp or the IP-ID field is sent, these fields are encoded using the same window of transmitted packets as used for SN encoding. Therefore, the decompressor does not send back these fields on the reverse/feedback channel in order to acknowledge them. The window can also be seen as a window of vectors (SN, TS, IP-ID). A given vector can be acknowledged by returning only the SN field.

One embodiment performs header compression based on an acknowledgment framework to transmit SN, TS and IP-ID when these fields have to be transmitted. Other encodings can be used for TS and IP-ID. This header compression scheme is summarized below.

Transition to FO and SO States Using Acknowledgments

When a new session starts, the compressor operates in FH state until receiving an acknowledgment (ACK) from the decompressor, indicating that at least one FH packet has been received. It is the responsibility of the decompressor to acknowledge an FH packet as soon as it receives it, so that the compressor can transit from FH state to FO state. Acknowledgments may contain either the compressed current value which is decompressed by the decompressor or the uncompressed current value. Either quantity permits the compressor to update the state of compression and initiate discarding of the old values.

In the FO state, the compressor transmits FO packets and the decompressor is supposed to acknowledge received FO packets (not necessarily every FO packet). If the compressor determines (based on the ACKs) that the decompressor has established an FOD, and that FOD is same as the FOD between the current header being transmitted and the last transmitted header, the compressor then advances to SO state and starts sending SO packets.

Due to the reasons discussed above, the compressor may have to fallback from SO state to FO state. However, the compressor never transits back to FH state unless some exceptional events happen, such as decompressor loses its context because of system crash. Whenever the compressor is in FO state, it tries to advance to SO state as described above.

Suitable packet types are disclosed in Application Ser. No. 09/536,639, filed on even date herewith, entitled "Method and System for Transmitting and Receiving Packets".

Two variations of VLE, referred to Fixed Length Encoding (FLE) and One Sided Variable Length Encoding (OVLE) are described below.

Fixed Length Encoding (FLE)

Fixed length encoding may be used, if it is known for sure that, the range r=(v_max–v_min) never exceeds an upper-bound. Every value is encoded with the same number of bits which is the smallest number of bits needed to cover this range. The length does not need to be transmitted in that case since it is assumed to be a known constant.

One Sided Variable Length Encoding (OVLE)

The previously described VLE is based on a function which maps to a reference value v_ref and a number of bits k which returns the search interval $]v\_ref-2^{k-1}, v\_ref+2^{k-1}]$. This is very general and flexible, as it can accommodate arbitrary changes (positive, negative) from one value to the next. However, this interval is not the most efficient when used for a field which is monotonic. In effect, the decompressor picks up a decompressed value only in the subset $]v\_ref, v\_ref+2^{k-1}]$.

In the case of RTP header compression, the fields usually arrive to the compressor in increasing order. However, there are exceptions because of possible misordering upstream from the compressor or in the case of the timestamp, an encoder might not deliver the coded frames in the order they were sampled. In order to improve efficiency, it may be worth using a function which would return a search interval which is not centered on v_ref, for instance the interval $]v\_ref-2^{k-2}, v\_ref+3*2^{k-2}]$.

When VLE is used as part of an adaptive header compression application, it is possible to use the interval $]v\_ref, v\_ref+2^k]$ which is the most efficient for a given k. This is referred to as one sided variable length encoding (OVLE). VLE is used for FO packets and OVLE for SO packets as long as the compressor incoming values are increasing. In the case that a misordering of packets occurs before the compressor, the compressor always compresses the packet as an FO packet. Alternatively, the compressor could reorder and/or drop packets in order to stay in the SO state even if misordering occurs.

An Optimal Acknowledgment Algorithm for the Variable Length Encoding (VLE) and One-sided VLE (OVLE) of Compressed Data To improve the overall compression efficiency, it is desirable to keep the size of the acknowledgment sent by the decompressor to the compressor to a minimum. In the algorithm discussed herein, the decompressor only needs to send in an acknowledgment the same number of bits (or at most 2 more bits, as described later) as it has received in the compressed message.

As described in VLE and OVLE, the compressor maintains a sliding window of values VSW and stores each of the original uncompressed values in VSW after transmission to the decompressor.

$$VSW: v_1, v_2, v_3, \ldots v_i, \ldots V_n$$

Note: $v_1$ is the oldest value, and $v_n$ the youngest)

Case 1: Single Encoding Method

It is assumed that only one encoding method is used (either VLE or OVLE) and both the compressor and the decompressor know which one is being used. When the decompressor successfully receives a compressed value and decides to acknowledge it, it simply copies the received compressed value into the acknowledgment and transmits it back to the compressor.

When the compressor receives an acknowledgment message, it processes the acknowledgment in the following three steps:

1) Uses $v_1$ (the oldest value) in VSW as the reference value and decompresses the compressed value in the acknowledgment following the same rules as the decompressor. The decompressed value is identified as v_acked.

2) Searches the VSW from head (oldest) to tail (youngest), for the first (oldest) occurrence of v_acked.

3) Deletes all the values preceding (older than) v_acked.

It can be shown that the above algorithm works by observing the following property of the VSW:

If $v_i$ in HSW was sent by the compressor using k bits, it can be correctly decompressed using the same k bits and using any $v_j (j \Box i)$ as the reference value.

Specifically, $v_1$ can be used as the reference value to decompress any value in the VSW. Combined with the fact that an acknowledgment always acknowledges one of the values in the VSW, it is concluded that v_acked derived in step 1) is indeed the correct original value that triggered the acknowledgment message.

Case 2: Multiple Encoding Methods

In this case, the decompressor dynamically switches encoding methods between VLE and OVLE. It is only needed to change the aforementioned algorithm slightly to handle this case. Basically, in each acknowledgment message, the decompressor must add a flag to indicate which encoding method was used to compress the received value. Therefore, when the compressor receives an acknowledgment message, it can choose the correct decompression method based on the encoding flag in the acknowledgment. As long as the property of the VSW holds, the modified algorithm is correct, based on the same reasoning as in the previous section.

Also when VLE and/or OVLE are applied to header compression, the encoding flag need not be carried explicitly in the compressed headers sent from the compressor to the decompressor, since decompressor can derive that information implicitly based on header type and other configuration information. However, on the reverse direction, the flag has to be carried explicitly in the acknowledgment message. In the worst case, 2 bits are needed to differentiate three possibilities: VLE, plus-sided OVLE, minus-side OVLE. The encoding flag could be reduced to one bit if the side information of OVLE is predefined.

Duplicated Values in VSW

There is one special case that has not been discussed above. It is possible that the same (original uncompressed) value may occur more than once in the compressor sliding window. This needs to be considered for the following two reasons: 1) in theory, the algorithm should be generic and work for any sequence of values; 2) in practice, RTP Timestamps for some video codes do have this behavior.

The problem is that, although the calculated value v_acked is still correct, the compressor cannot determine which occurrence (if it found multiple occurrences) of the v_acked in VSW actually triggered the ACK.

However, it should be noted that the algorithm works, since the compressor always chooses the first (oldest) occurrence of v_acked in VSW. If it is not the correct instance that triggered the acknowledgment, the only side effect is that less values were deleted from the VSW than should have been. As a result, the new values arriving thereafter may be encoded using more bits than necessary.

If a duplication of values seldom occurs, no modification to the aforementioned algorithm is necessary, since the compressor is brought out of its less-than-optimal state as soon as another (unambiguous) acknowledgment arrives which acknowledges a value that occurs only once in the VSW.

If duplicated values are expected to happen frequently, extra information may be added to remove the ambiguity of an acknowledgment. One example is to assign a generation number (GN) to each compressed value and require the decompressor to put the GN in the acknowledgment.

Figure 9A:
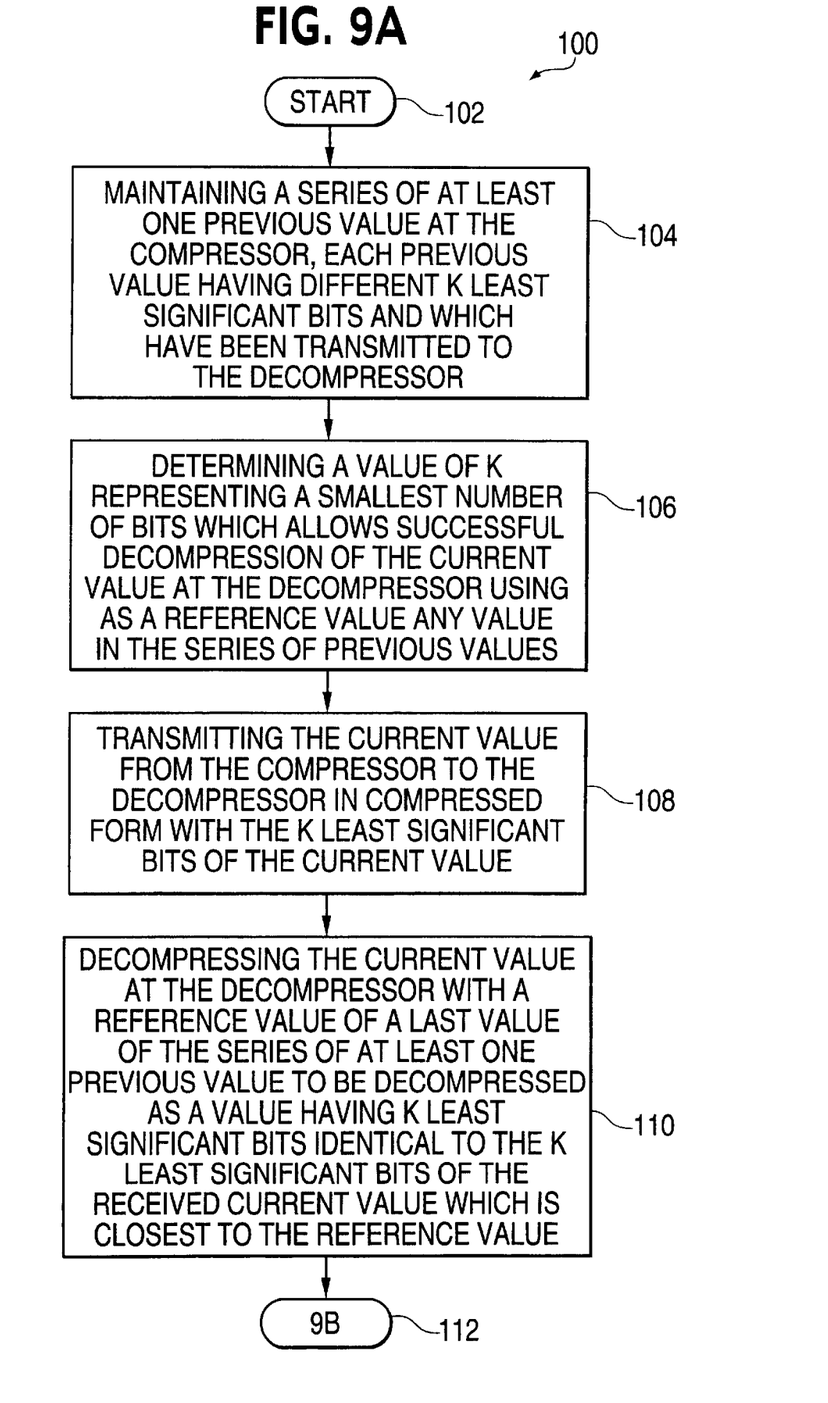
FIGS. 9A and B are a flow chart of a method of compressing a current value into a minimum number of bits for transmission from a compressor to a decompressor in accordance with the invention.
Figure 9B:
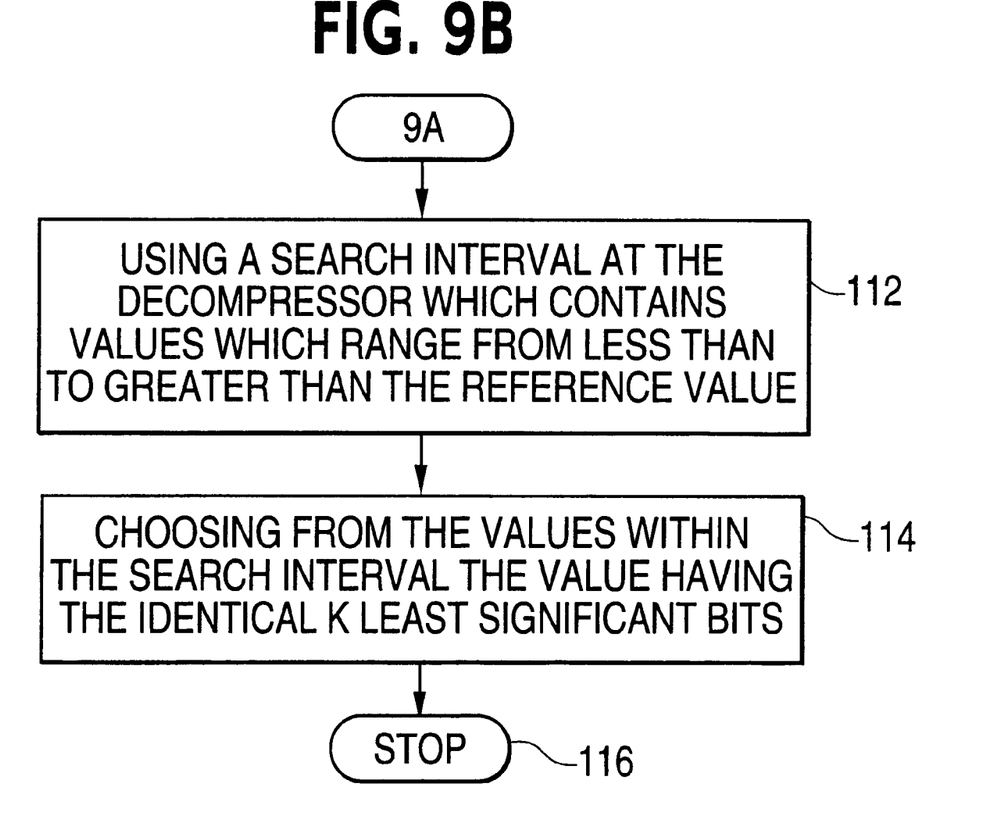

FIG. 9 illustrates a method of compressing a current value into a minimum number of bits for transmission from a compressor to a decompressor. The method 100 proceeds from starting point 102 to point 104 where maintaining a series of at least one previous value at the compressor, each previous value having different k least significant bits and which have been transmitted to the decompressor occurs. The method proceeds from point 104 to point 106 where determining a value of k representing a smallest number of bits which allows successful decompression of the current value at the decompressor using as a reference value any value in the series of previous values occurs. The method proceeds from point 106 to point 108 where transmitting the current value from the compressor to the decompressor in compressed form with the k least significant bits of the current value occurs. The method proceeds from point 108 to point 110 where decompressing the current value at the decompressor with a reference value of a last value of the series of at least one previous value to be decompressed as a value having k least significant bits identical to the k least significant bits of the received current value which is closest to the reference value occurs. The method proceeds from point 110 to point 112 where using a search interval at the decompressor which contains values which range from less than to greater than the reference value occurs. The method proceeds from point 112 to point 114 where choosing from the values within the search interval the value having the identical k least significant bits occurs. The method proceeds from point 114 to stopping point 116.

Figure 10:
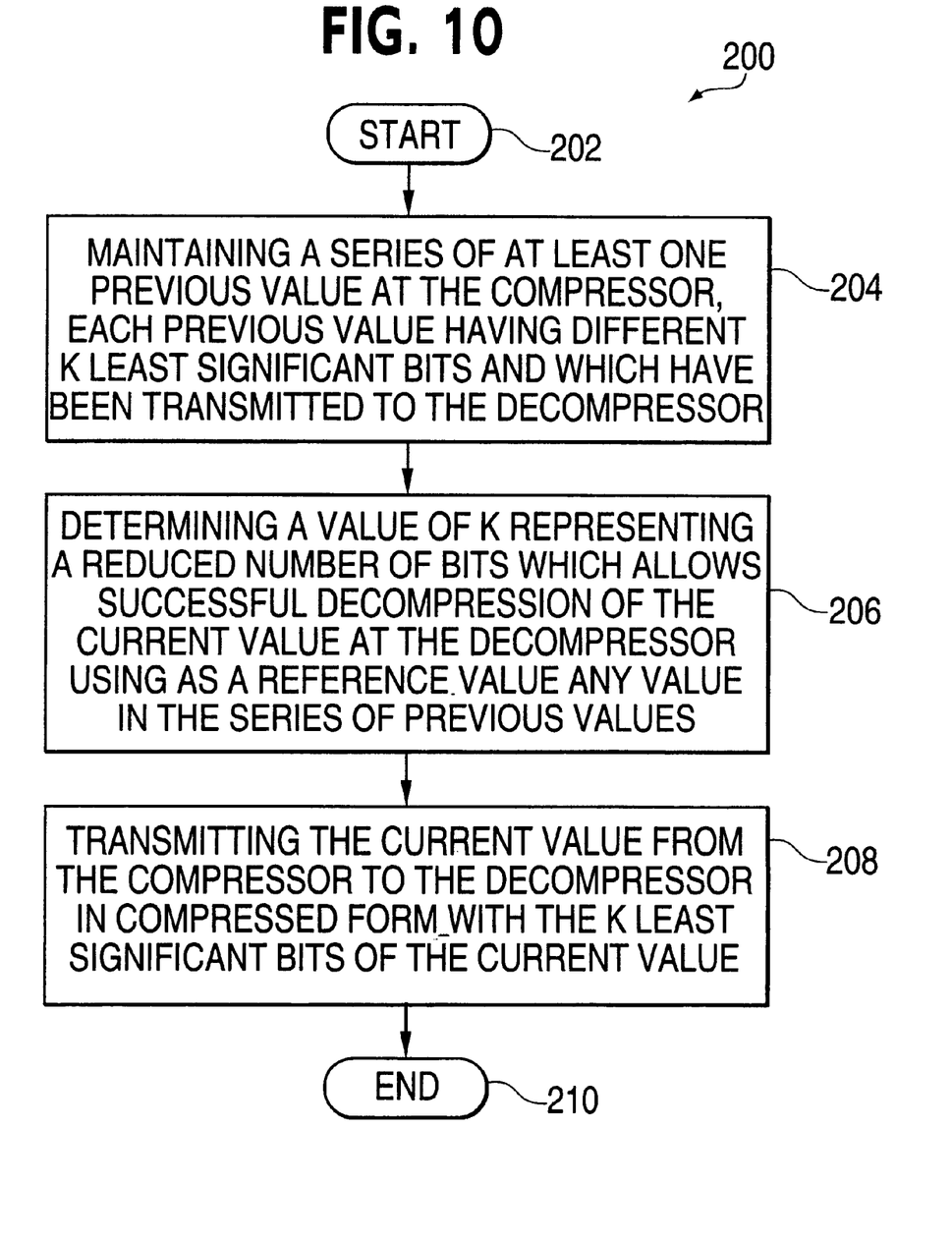
FIG. 10 is a flow chart of a method of compressing a current value into a reduced number of bits for transmission from a compressor to a compressor in accordance with the invention.

FIG. 10 illustrates a method of compressing a current value into a reduced number of bits for transmission from a compressor to a decompressor in accordance with the present invention. The method 200 proceeds from starting point 202 to point 204 where maintaining a series of at least one previous value at the compressor, each previous value having different k least significant bits and which have been transmitted to the decompressor occurs. The method proceeds form point 204 to point 206 where determining a value of k representing a reduced number of bits which allows successful decompression of the current value at the decompressor using as a reference value any value in the series of previous values occurs. Processing proceeds from point 206 to point 208 where transmitting the current value from the compressor to the decompressor in compressed form with the k least significant bits of the current value occurs. Processing proceeds from point 208 to end point 210.

While the invention has been described with reference to its preferred embodiments, it should be understood that numerous modifications may be made thereto without departing from the spirit and scope thereof. It is intended that all such modifications fall within the scope of the appended claims.

What is claimed is:

1. A method of compressing a current value into a minimum number of bits for transmission from a compressor to a decompressor comprising:

maintaining a series of at least one previous value at the compressor, each previous value having different k least significant bits and which have been transmitted to the decompressor;

determining a value of k representing a smallest number of bits which allows successful decompression of the current value at the decompressor using as a reference value any value in the series of the at least one previous value; and transmitting the current value from the compressor to the decompressor in compressed form with the k least significant bits of the current value.

2. A method in accordance with claim 1 wherein:

the value of k is determined by comparing the current value with the at least one previous value to determine a maximum difference r between the current value and the at least one previous value with k being an integer chosen to be the smallest integer which is greater than $\log_2^{(r)}+1$.

3. A method in accordance with claim 1 wherein:

the decompressor transmits at least one acknowledgment to the compressor which indicates that the decompressor has decompressed a value and the compressor updates the series of at least one previous value to discard at least one older previous value.

4. A method in accordance with claim 2 wherein:

the decompressor transmits at least one acknowledgment to the compressor which indicates that the decompressor has decompressed a value and the compressor updates the series of at least one previous value to discard at least one older previous value.

5. A method in accordance with claim 1 further comprising:

decompressing the current value at the decompressor with a reference value of a last value of the series of at least one previous value to be decompressed as a value having k least significant bits identical to the k least significant bits of the received current value which is closest to the reference value.

6. A method in accordance with claim 2 further comprising:

decompressing the current value at the decompressor with a reference value of a last value of the series of at least one previous value to be decompressed as a value having k least significant bits identical to the k least significant bits of the received current value which is closest to the reference value.

7. A method in accordance with claim 3 further comprising:

decompressing the current value at the decompressor with a reference value of a last value of the series of at least one previous value to be decompressed as a value having k least significant bits identical to the k least significant bits of the received current value which is closest to the reference value.

8. A method in accordance with claim 4 further comprising:

decompressing the current value at the decompressor with a reference value of a last value of the series of at least one previous value to be decompressed as a value having k least significant bits identical to the k least significant bits of the received current value which is closest to the reference value.

9. A method in accordance with claim 5 further comprising:

using a search interval at the decompressor which contains values which range from less than to greater than the reference value; and choosing from the values within the search interval the value having the identical k least significant bits.

10. A method in accordance with claim 6 further comprising:

using a search interval at the decompressor which contains values which range from less than to greater than the reference value; and choosing from values within the search interval the value having the identical k least significant bits.

11. A method in accordance with claim 7 further comprising:

using a search interval at the decompressor which contains values which range from less than to greater than the reference value; and choosing from values within the search interval the value having the identical k least significant bits.

12. A method in accordance with claim 8 further comprising:

using a search interval at the decompressor which contains values which range from less than to greater than the reference value; and choosing from the values within the search interval the value having the identical k least significant bits.

13. A method in accordance with claim 1 wherein:

the value of k is produced from mapping a reference value v_ref and the number of bits k to the series of at least one previous value and the current value; and the series of the at least one previous value are updated to have as an oldest value an oldest transmitted value which has been acknowledged to have been decompressed by the decompressor.

14. A method in accordance with claim 2 wherein:

the value of k is produced from mapping a reference value v_ref and the number of bits k to the series of at least one previous value and the current value; and the series of the at least one previous value are updated to have as an oldest value an oldest transmitted value which has been acknowledged to have been decompressed by the decompressor.

15. A method in accordance with claim 3 wherein:

the value of k is produced from mapping a reference value v_ref and the number of bits k to the series of at least one previous value and the current value; and the series of the at least one previous value are updated to have as an oldest value an oldest transmitted value which has been acknowledged to have been decompressed by the decompressor.

16. A method in accordance with claim 4 wherein:

the value of k is produced from mapping a reference value v_ref and the number of bits k to the series of at least one previous value and the current value; and the series of the at least one previous value are updated to have as an oldest value an oldest transmitted value which has been acknowledged to have been decompressed by the decompressor.

17. A method in accordance with claim 5 wherein:

the value of k is produced from mapping a reference value v_ref and the number of bits k to the series of at least one previous value and the current value; and the series of the at least one previous value are updated to have as an oldest value an oldest transmitted value which has been acknowledged to have been decompressed by the decompressor.

18. A method in accordance with claim 6 wherein:

the value of k is produced from mapping a reference value v_ref and the number of bits k to the series of at least one previous value and the current value; and the series of the at least one previous value are updated to have as an oldest value an oldest transmitted value which has been acknowledged to have been decompressed by the decompressor.

19. A method in accordance with claim 7 wherein:

the value of k is produced from mapping a reference value v_ref and the number of bits k to the series of at least one previous value and the current value; and the series of the at least one previous value are updated to have as an oldest value an oldest transmitted value which has-been acknowledged to have been decompressed by the decompressor.

20. A method in accordance with claim 8 wherein:

the value of k is produced from mapping a reference value v_ref and the number of bits k to the series of at least one previous value and the current value; and the series of the at least one previous value are updated to have as an oldest value an oldest transmitted value which has been acknowledged to have been decompressed by the decompressor.

21. A method in accordance with claim 9 wherein:

the value of k is produced from mapping a reference value v_ref and the number of bits k to the series of at least one previous value and the current value; and the series of the at least one previous value are updated to have as an oldest value an oldest transmitted value which has been acknowledged to have been decompressed by the decompressor.

22. A method in accordance with claim 10 wherein:

the value of k is produced from mapping a reference value v_ref and the number of bits k to the series of at least one previous value and the current value; and the series of the at least one previous value are updated to have as an oldest value an oldest transmitted value which has been acknowledged to have been decompressed by the decompressor.

23. A method in accordance with claim 11 wherein:

the value of k is produced from mapping a reference value v_ref and the number of bits k to the series of at least one previous value and the current value; and the series of the at least one previous value are updated to have as an oldest value an oldest transmitted value which has been acknowledged to have been decompressed by the decompressor.

24. A method in accordance with claim 12 wherein:

the value of k is produced from mapping a reference value v_ref and the number of bits k to the series of at least one previous values and the current value; and the series of the at least one previous value are updated to have as an oldest value an oldest transmitted value which has been acknowledged to have been decompressed by the decompressor.

25. A method in accordance with claim 1 wherein:

the value of k is a function of a reference value and the number of bits k.

26. A method in accordance with claim 25 wherein:

the function is $]v\_ref-2^{k-1}, v\_ref+2^{k-1}]$.

27. A method in accordance with claim 25 wherein:

the function is $]v\_ref, v\_ref+2^{k}]$.

28. A method in accordance with claim 3 wherein:

the at least one acknowledgment is a received uncompressed value.

29. A method in accordance with claim 3 wherein:

the at least one acknowledgment is a received compressed value.

30. A method in accordance with claim 29 wherein:

the at least one acknowledgment is the received compressed value including information used in coding a portion of the compressed value.

31. A method in accordance with claim 28 wherein:

the at least one acknowledgment contains an oldest value in the series of the at least one previous value.

32. A method in accordance with claim 29 wherein:

the at least one acknowledgment contains an oldest value in the series of the at least one previous value.

33. A method in accordance with claim 1 wherein:

the series of the at least one previous value is updated to discard older previous values based upon an estimated maximum number of values which can be lost during transmission in a sequence of values between the compressor and the decompressor.

34. A method in accordance with claim 1 wherein:

the compressed current value encodes the value of k which is transmitted with the current value.

35. A method in accordance with claim 34 wherein:

the encoding is Huffman encoding.

36. A method in accordance with claim 1 wherein:

the value of k comprises a Real Time Transport protocol header.

37. A method in accordance with claim 32 wherein:

the at least one acknowledgment is an acknowledgment of a Real Time Transport protocol Sequence Number header representing an acknowledgment of a Time Stamp and Internet Protocol Identification in the Real Time Protocol header.

38. A system for compressing a current value into a minimum number of bits comprising:

a compressor which maintains a series of at least one previous value, each previous value having different k least significant bits;

a decompressor which receives the current value compressed into a minimum number of k least significant bits from the compressor; and wherein the compressor determines a value of k representing a smallest number of bits which allows successful decompression of the current value at the decompressor using as a reference any value in the series of at least one previous value.

39. A system in accordance with claim 38 wherein:

the value of k is determined by comparing the current value with the at least one previous value to determine a maximum difference r between the current value and the at least one previous value with k being an integer chosen to be the smallest integer which is greater than $\log_2^{(r)}+1$.

40. A system in accordance with claim 38 wherein:

the decompressor transmits at least one acknowledgment to the compressor which indicate that the decompressor has decompressed a value and the compressor updates the series of the at least one previous value to discard older previous values.

41. A system in accordance with claim 39 wherein:

the decompressor transmits at least one acknowledgment to the compressor which indicate that the decompressor has decompressed a value and the compressor updates the series of the at least one previous value to discard older previous values.

42. A system in accordance with claim 38 wherein:

the decompressor decompresses the current value at the decompressor with a reference value of a last value of the series of the at least one previous value to be decompressed as a value having k least significant bits identical to the k least significant bits of the received current value which is closest to the reference value.

43. A system in accordance with claim 39 wherein:

the decompressor decompresses the current value at the decompressor with a reference value of a last value of the series of the at least one previous value to be decompressed as a value having k least significant bits identical to the k least significant bits of the received current value which is closest to the reference value.

44. A system in accordance with claim 40 wherein:

the decompressor decompresses the current value at the decompressor with a reference value of a last value of the series of the at least one previous value to be decompressed as a value having k least significant bits identical to the k least significant bits of the received current value which is closest to the reference value.

45. A system in accordance with claim 41 wherein:

the decompressor decompresses the current value at the decompressor with a reference value of a last value of the series of the at least one previous value to be decompressed as a value having k least significant bits identical to the k least significant bits of the received current value which is closest to the reference value.

46. A system in accordance with claim 42 further comprising:

the decompressor uses a search interval which contains values which range from less than to greater than the reference value; and chooses from the values within the search interval the value having the identical k least significant bits.

47. A system in accordance with claim 43 further comprising:.

the decompressor uses a search interval which contains values which range from less than to greater than the reference value; and chooses from the values within the search interval the value having the identical k least significant bits.

48. A system in accordance with claim 44 further comprising:

the decompressor uses a search interval which contains values which range from less than to greater than the reference value; and chooses from the values within the search interval the value having the identical k least significant bits.

49. A system in accordance with claim 45 further comprising:

the decompressor uses a search interval which contains values which range from less than to greater than the reference value; and chooses from the values within the search interval the value having the identical k least significant bits.

50. A system in accordance with claim 38 wherein:

the compressor produces the value of k from mapping a reference value v_ref and the number of bits k to the series of at least one previous value and the current value; and the series of at least one previous value are updated to have as an oldest value an oldest transmitted value which has been acknowledged to have been decompressed by the decompressor.

51. A system in accordance with claim 38 wherein:

the value of k is a function of a reference value and the number of bits k; and the function is $]v\_ref-2^{k-1}, v\_ref+2^{k-1}]$.

52. A system in accordance with claim 38 wherein:

the value of k is a function of a reference value and the number of bits k; and the function is $]v\_ref, v\_ref+2^k]$.

53. A system in accordance with claim 40 wherein:

the at least one acknowledgment is a received uncompressed value.

54. A system in accordance with claim 40 wherein:

the at least one acknowledgment is a received compressed value.

55. A system in accordance with claim 54 wherein:

the at least one acknowledgment is the received compressed value including information used in coding a portion of the compressed value.

56. A system in accordance with claim 38 wherein:

the series of the at least one previous value is updated by the compressor to discard at least one older previous value based upon an estimated maximum number of values which can be lost during transmission in a sequence of values between the compressor and the decompressor.

57. A system in accordance with claim 38 wherein:

the compressed current value encodes the value of k which is transmitted with the current value.

58. A system in accordance with claim 38 wherein:
the values of k comprise Real Time Headers.

59. A system in accordance with claim 40 wherein:
the at least one acknowledgment is an acknowledgment of a Real Time Transport Protocol Sequence Number header representing an acknowledgment of a Time Stamp and Internet Protocol Identification in the Real Time Protocol header.

60. A method of compressing a current value into a reduced number of bits for transmission from a compressor to a decompressor comprising:

maintaining a series of at least one previous value at the compressor, each previous value having different k least significant bits and which have been transmitted to the decompressor;

determining a value of k representing a reduced number of bits which allows successful decompression of the current value at the decompressor using as a reference value any value in the series of the at least one previous value; and transmitting the current value from the compressor to the decompressor in compressed form with the k least significant bits of the current value.

\* \* \* \* \*